(12) United States Patent
Bang et al.

(10) Patent No.: US 6,795,233 B2
(45) Date of Patent: Sep. 21, 2004

(54) CROSS-GAIN MODULATION TYPE OPTICAL WAVELENGTH CONVERTER HAVING HIGH EXTINCTION RATIO AND WIDE INPUT DYNAMIC RANGE

(75) Inventors: Joon Hak Bang, Daejeon (KR); Je Soo Ko, Daejeon (KR)

(73) Assignee: Electronics & Telecommunications Research Institute (KR)

( * ) Notice: Subject to any disclaimer, the term of this patent is extended or adjusted under 35 U.S.C. 154(b) by 50 days.

(21) Appl. No.: 10/360,453

(22) Filed: Feb. 6, 2003

(65) Prior Publication Data

US 2004/0090662 A1 May 13, 2004

(30) Foreign Application Priority Data

Nov. 7, 2002 (KR) ................................ 10-2002-0068907

(51) Int. Cl.[7] ................................................. G02F 1/35
(52) U.S. Cl. ...................................... 359/326; 359/332
(58) Field of Search ................................. 359/326–332

(56) References Cited

U.S. PATENT DOCUMENTS 5,450,229 A    9/1995  Wiesenfeld
6,577,435 B1 *  6/2003  Bang et al. ................. 359/326
2001/0031110 A1 * 10/2001  Imajuku et al. ............... 385/15

OTHER PUBLICATIONS

IEEE Photonics Technology Letters, vol. 9, No. 12, Dec. 1997, p. 1583–1585, D. Mahgerefteh et al, "Technique for Suppession . . . Converter".

* cited by examiner

Primary Examiner—John D. Lee
(74) Attorney, Agent, or Firm—Blakely, Sokoloff Taylor & Zafman

(57) ABSTRACT

The present invention provides a cross-gain modulation type optical wavelength converter having a high extinction ratio and a wide input dynamic range, which is capable of preventing an extinction ratio from lowering and allowing an input dynamic range to widen. The XGM type optical wavelength converter of the present invention allows a probe light to be cross-gain modulated by a pump light one more time using two SOAs, and allows the width of the modulation of the probe light to be further broadened, thereby improving the extinction ratio after wavelength conversion. Simultaneously, the XGM type optical wavelength converter detects the intensity of an optical signal inputted to the optical wavelength converter and automatically controls the intensity of the probe light on the basis of the detected intensity of the input optical signal, thereby providing a wide input dynamic range.

8 Claims, 4 Drawing Sheets

INPUT OPTICAL SIGNAL
INTENSITY MODULATED
IN 2.5 Gb/S
(EXTINCTION RATIO : 15.52dB)

10nm DOWN-CONVERSION
(EXTINCTION RATIO : 9.26dB)

10nm DOWN-CONVERSION
(EXTINCTION RATIO : 12.91dB)

2nm UP-CONVERSION
(EXTINCTION RATIO : 5.92dB)

2nm UP-CONVERSION
(EXTINCTION RATIO : 8.86dB)

CROSS-GAIN MODULATION TYPE OPTICAL WAVELENGTH CONVERTER HAVING HIGH EXTINCTION RATIO AND WIDE INPUT DYNAMIC RANGE

BACKGROUND OF THE INVENTION

1. Field of the Invention

The present invention relates generally to a cross-gain modulation type optical wavelength converter, and more particularly to a cross-gain modulation type optical wavelength converter which is capable of preventing an extinction ratio from lowering and allowing an input dynamic range to widen.

2. Description of the Prior Art

As the amount of transmitted information has rapidly increased recently, demands on transmission capacities of communication networks have increased and the capacities of transmission systems tend to grow increasingly large due to the increasing demands. In this circumstance of various technologies of increasing a transmission velocity that have been proposed up to now, a Wavelength Division Multiplexing (WDM) transmission technology has been most actively studied in that communication can be carried out over a wide bandwidth provided by optical fiber by utilizing the optical wavelengths of various channels. An optical wavelength converter is an important element of a communication network using a WDM transmission apparatus, along with a semiconductor optical amplifier (SOA). Such an optical wavelength converter generally converts the wavelength of a signal using the cross-gain modulation (XGM), cross-phase modulation (XPM) or photo-electric-photo conversion of an optical signal and a probe light.

In general, wavelength converters are apparatuses that convert wavelengths of transmission signals without regard to transmission velocities and transmission methods. The wavelength converters serve to reduce wavelength blocking caused by wavelength contention in WDM communication networks and increase the flexibility and capacity of the networks for fixed wavelengths by reusing useful wavelengths. Additionally, the wavelength converters serve to allow networks to be managed while being distributed, and additionally serve to allow protection switching to be easily performed.

There are various embodiments of the optical wavelength converters, which may be classified into three types. The first is an XGM type using the XGM characteristics of an SOA. The second is an XPM type using the XPM characteristics of an SOA. The third is a Four Wave Mixing (FWM) type, which generates optical signals having new wavelengths and wavelength-convert the optical signals through FWM. The XGM type is most commonly used and simplest to implement.

Such a conventional XGM type optical wavelength converter is shown in FIG. 1. Referring to FIG. 1, a pump light 102 is an intensity-modulated input optical signal having a wavelength of $\lambda_s$. A probe light 106 is a Continuous Wave (CW) light having a wavelength $\lambda_c$, which is outputted from a CW light source 104. The pump light 102 and probe light 106 are simultaneously inputted to an SOA 101. The gain of the SOA 101 is modulated by the pump light 102. The probe light 106 is influenced by the gain modulation Of the SOA 101, so the probe light 106 is intensity-modulated in the same manner as the pump light 102. Since the SOA 101 outputs the pump light 102 and the wavelength-converted probe light at its output terminal, a Band-Pass Filter (BPF) 107 is employed to pass therethrough only a wavelength-converted light 103.

The conventional XGM type optical wavelength converter is problematic in that the extinction ratio of a wavelength-converted signal outputted from the SOA at the time of wavelength conversion is lowered due to the gain characteristics of the SOA, a bit stream is reversed and an input dynamic range is narrow.

Meanwhile, a method of reducing the gain recovery time of an SOA so as to wavelength-shift optical signals of a high bit rate in a wavelength-shifter using XGM characteristics in the SOA, is disclosed in U.S. Pat. No. 5,450,229 entitled "Optical wavelength-shifter with reduced gain recovery time" and issued to Jay M. Wiesenfeld. This patent provides a method of wavelength-shifting optical signals of a high bit rate by using characteristics of reducing gain recovery time of an amplifier by the intensity of a CW light and, thus, reducing rise time at the time of XGM of the CW light in a general optical wavelength-shifter, thereby wavelength-shifting the optical signals having a bit rate of 10 Gb/s or higher using the gain saturation characteristics of a SOA.

Furthermore, in "Technique for Suppression of Pattern Dependence in a Semiconductor Optical Amplifier Wavelength converter", IEEE Photonics Technology Letters, Vol. 9, No. 12, pp. 1583–1585, December 1997, a method of reducing pattern dependence in a wavelength converter using XGM characteristics in an SOA was proposed by D. Mahgereft eh et al., in 1997. Generally, wavelength conversion using XGM characteristics in an SOA is a reaction dependent on the pattern of the SOA, and has a limitation in a bit rate of data to be converted. Accordingly, in this method, the pattern dependence is solved by converting phase modulation to amplitude modulation at the time of data transition using a fiber grating filter.

In the conventional XGM type optical wavelength converter, the lowering of the extinction ratio of a wavelength-converted signal outputted from the SOA due to the gain characteristics of the SOA at the time of wavelength conversion and the narrowing of the input dynamic range cannot be fundamentally overcome.

SUMMARY OF THE INVENTION

The present invention provides an optical wavelength converter, which is provided with a high extinction ratio and a wide dynamic input range by allowing a probe light to be primarily influenced by cross-gain modulation of the first SOA caused by the first pump light and to be secondarily influence by cross-gain modulation of the second SOA caused by the second pump light, and by detecting the intensity of an optical signal inputted to the optical wavelength converter and automatically controlling the intensity of the probe light on the basis of the detected intensity of the input optical signal, respectively.

The foregoing and other objects of the present invention are achieved by providing a cross-gain modulation type optical wavelength converter converting the optical wavelength of a probe light outputted from a continuous wave light source by using an intensity-modulated pump light, comprising: an optical division unit for dividing the intensity-modulated pump light into first pump light and second pump light on a basis of a predetermined light intensity ratio; a first control unit for detecting an intensity of the first pump light and controlling an intensity of the probe light outputted from the continuous wave light source in proportion to the detected intensity of the first pump light; a first semiconductor optical amplifier for performing a cross-gain modulation by using the first pump light and first converting the wavelength of the probe light outputted from the continuous wave light source on a basis of the cross-gain modulation; a second control unit for controlling an intensity of the first wavelength-converted probe light outputted from the first semiconductor optical amplifier in proportion to an intensity of the second pump light; and a second semiconductor optical amplifier for performing a cross-gain modulation by using the second pump light and second converting the wavelength of the first wavelength-converted probe light intensity-controlled by the second control unit on a basis of the cross-gain modulation.

It is preferable that the optical wavelength converter further comprises an optical phase control unit for controlling a phase of the second pump light so as to be in phase with the first pump light.

Additionally, it is preferable that the first control unit comprises a first optical extraction means for extracting some of the first pump light, a first optical detection means for detecting the extracted first pump light and converting the extracted first pump light into an electrical signal, and a light source drive control means for controlling the continuous wave light source using the electrical signal and a preset electrical offset signal; and the second control unit comprises a second optical extraction means for extracting some of the second pump light, a second optical detection means for detecting the extracted second pump light and converting the extracted second pump light to an electrical signal, a second optical amplifier for amplifying an output signal of the second optical detection means by a certain amount, and a variable optical attenuator for controlling an attenuation intensity of the first wavelength-converted probe light outputted from the first semiconductor optical amplifier.

The present invention provides an XGM type optical wavelength converter having a high extinction ratio and a wide input dynamic range, which, in particular, prevents an extinction ratio from lowering and allows an input dynamic range to widen at the time of optical wavelength conversion using XGM characteristics in the SOA. The XGM type optical wavelength converter of the present invention allows a probe light to be one more time influenced by the cross-gain modulations of two SOAs caused by each pump light respectively, and allows the width of the modulation of the probe light to be further broadened, thereby improving the extinction ratio after wavelength conversion. Simultaneously, the XGM type optical wavelength converter of the present invention detects the intensity of an optical signal inputted to the optical wavelength converter and automatically controls the intensity of the probe light on the basis of the detected intensity of the input optical signal using the characteristics of performance of the XGM type optical wavelength converter on the basis of the intensity ratio of a pump light and a probe light inputted to each of the SOAs, thereby providing a wide input dynamic range. Accordingly, a low extinction ratio problem occurring in the conventional XGM type optical wavelength converter using a single SOA is overcome and, simultaneously, another problem that the performance of the optical wavelength converter varies very sensitively with the intensity of the input optical signal and that occurs in the conventional XGM type optical wavelength converter non-controlling the intensity of the probe light is overcome, so an operation bandwidth is significantly broadened with respect to the variations of the intensity of the optical signal inputted to the optical wavelength converter. Additionally, the Bit Error Rate (BER) characteristics of the optical wavelength converter of the present invention are improved compared to that of the conventional optical wavelength converter, and wavelength conversion can be performed with a constant extinction ratio being maintained with respect to the wide variations of the input optical signal.

BRIEF DESCRIPTION OF THE DRAWINGS

These and other objects and advantages of the invention will become apparent and more readily appreciated from the following description of a preferred embodiment, taken in conjunction with the accompanying drawings, of which.

DESCRIPTION OF THE PREFERRED EMBODIMENTS

Figure 1:
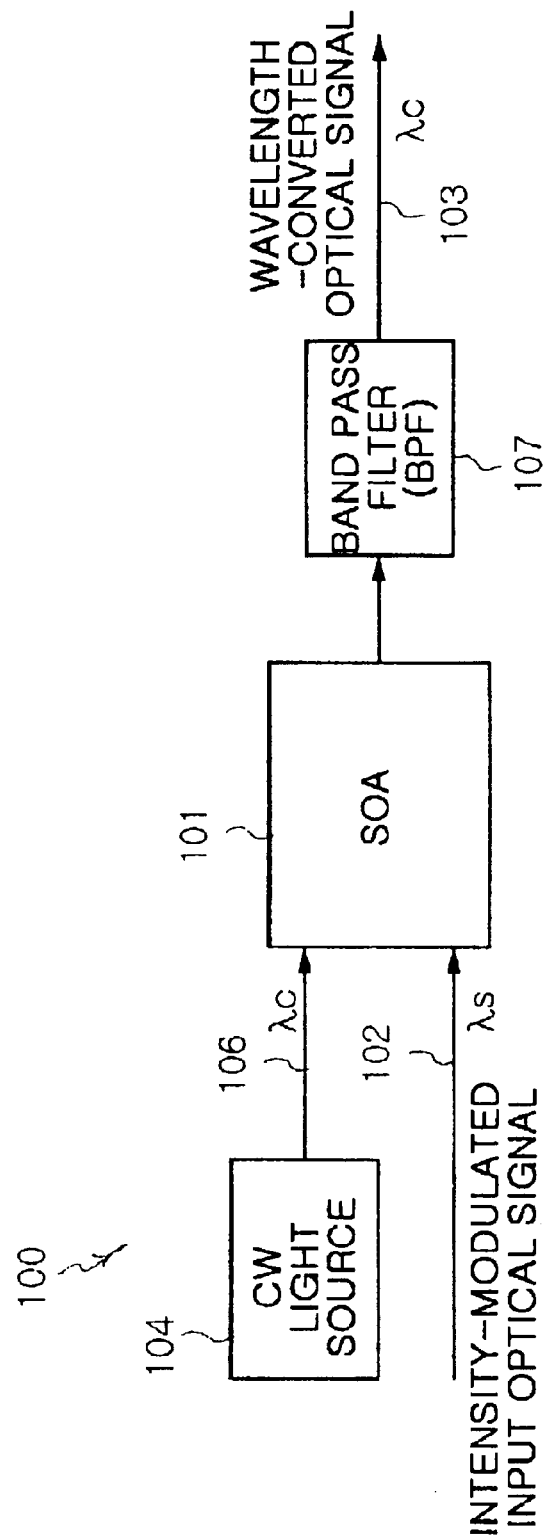
FIG. 1 is a block diagram showing a construction of a conventional XGM type optical wavelength converter.

Reference will now be made in detail to the present preferred embodiments of the present invention, examples of which are illustrated in the accompanying drawings, wherein like reference numerals refer to like elements throughout.

Hereinafter, a preferred embodiment of the present invention is described with reference to the accompanying drawings.

Figure 2:
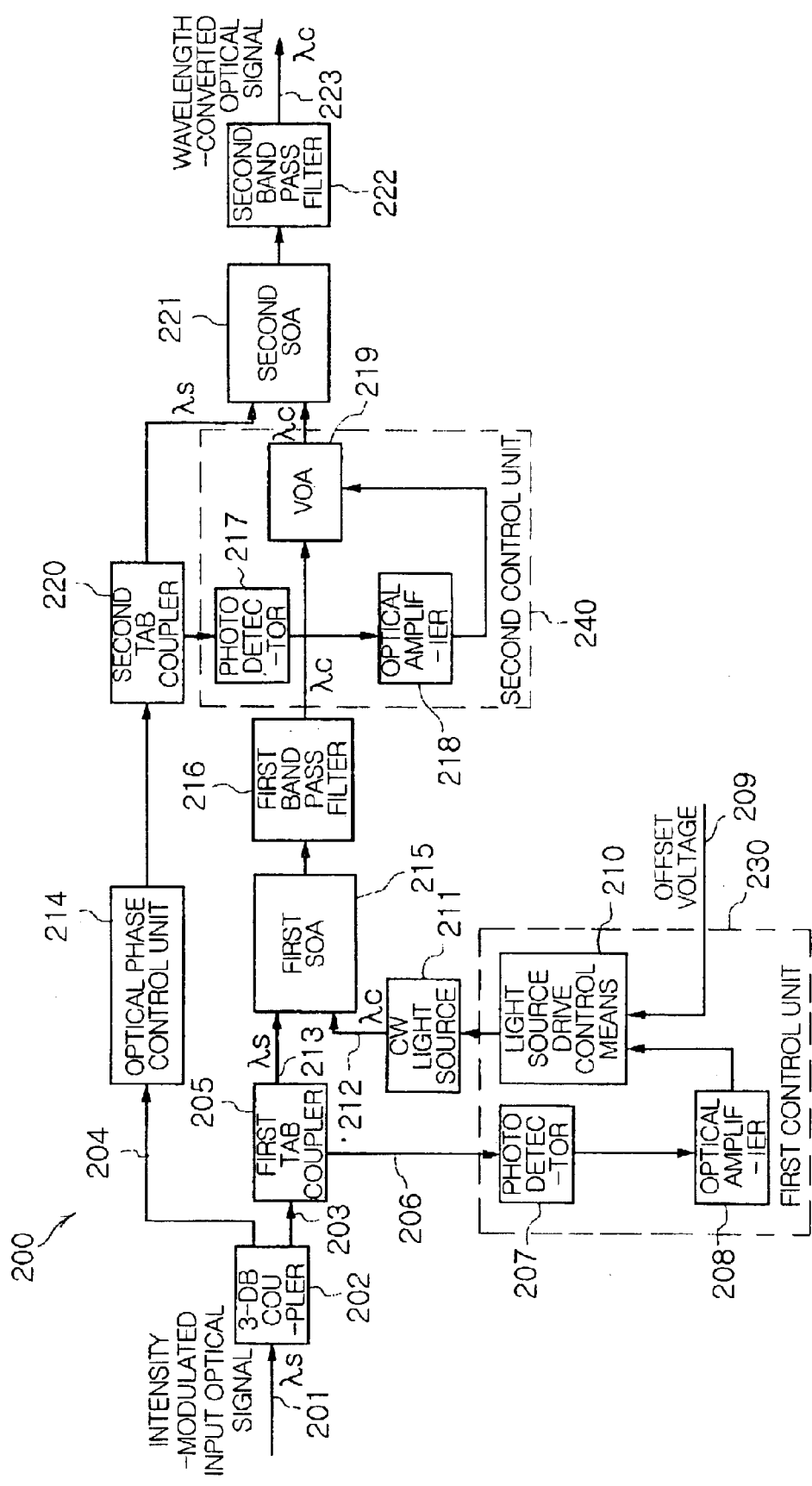
FIG. 2 is a block diagram showing a construction of an XGM type optical wavelength converter in accordance with an embodiment of the present invention.

FIG. 2 is a block diagram showing a construction of an XGM type optical wavelength converter in accordance with an embodiment of the present invention. As shown in FIG. 2, an optical wavelength converter 200 of the present invention, which is designed to improve an extinction ratio and an input dynamic range, includes a 3-dB coupler 202, first and second tab couplers 205 and 220, an optical phase control unit 214, first and second SOAs 215 and 221, a CW light source 211, first and second control units 230 and 240, and first and second band pass filters 216 and 222. The 3-dB coupler 202 divides an intensity-modulated pump light into first pump light 203 and the second pump light 204. The first and second tab couplers 205 and 220 extract some of the divided first and second pump lights 203 and 204, respectively. The optical phase control unit 214 equalizes the phases of the first and second pump lights 203 and 204. Each of the first and second SOAs 215 and 221 receives a pump light to carries out XGM, and converts a probe light, respectively. The CW light source 211 outputs the probe light to the first SOA 215. Each of the first and second control units 230 and 240 detects the intensity of the pump light, and controls the probe light inputted to each of the first and second SOAs 215 and 221 on the basis of the detected intensity of the pump light. The first and second band pass filters 216 and 222 passes therethrough only wavelength-converted probe lights of signals outputted from the first and second SOAs 215 and 221, respectively. In this case, the first control unit 230 includes a photo detector 207 that converts the extracted first pump light 206 outputted from the first tab coupler 205 into an electrical signal, an optical amplifier 208 that amplifies the electrical signal, and a light source drive control means 210 that adds the amplified signal to a preset electrical offset signal 209 and controls the CW light source 211. The second control unit 240 includes a photo detector 217 that converts the extracted second pump light outputted from the second tab coupler 220 to an electrical signal, an optical amplifier 218 that amplifies the electrical signal, and a Variable Optical Attenuator (VOA) 219 that controls the attenuation amount of the intensity of the wavelength-converted probe light outputted from the first SOA 215 using the amplified electrical signal.

Referring to FIG. 2, the optical wavelength converter of the present invention includes the two SOAs 215 and 221 that are sequentially arranged in front and in rear of the CW light source 211 respectively. Accordingly, the probe light having been influenced by the cross-gain modulation of the first SOA 215 caused by the pump light 213 is influenced by the cross-gain modulation of the second SOA 221 caused by the pump light 213 again, so the extinction ratio is improved. Simultaneously, the intensities of the first and second pump lights 213 and 204 inputted to the first and second SOAs 215 and 221 are detected by the first and second control units 230 and 240 and the probe lights inputted to the first and second SOAs 215 and 221 are controlled on the basis of the intensities of the detected pump lights, so the input dynamic range is widened.

Herein are described signal flows of the optical wavelength converter of the present invention as shown in FIG. 2. The first and second pump lights 203 and 204 are signals which are generated by desirably dividing an intensity-modulated input optical signal 201 having a wavelength of $\lambda_s$ into two halves of equal light intensities using the 3-DB coupler 202. The probe light 212 is a CW light having a wavelength of $\lambda_c$, which is outputted from the CW light source 211. The first pump light 203 passes through the first tab coupler 205, and the passed first pump light 213 is inputted to the first SOA 215. The second pump light 204 passes through the second tab coupler 220 and the optical phase control unit 214, and the passed second pump light is inputted to the second SOA 221. The pump lights inputted to the first and second SOAs 215 and 221 should be optical signals having the same intensity originating from the same light source so that the probe lights are influenced by the same XGM in the first and second SOAs 215 and 221. For this reason, the input optical signal 201 is divided by the 3-dB coupler 202, and then the divided pump lights are inputted to the first and second SOAs 215 and 221, respectively. The phases of electrical signals carried on the two pump lights inputted to the SOAs 215 and 221 should equal each other, so the phase of the pump light inputted to the second SOA 221 is controlled by the optical phase control unit 214 so as to equalize that of the pump light inputted to the first SOA 215.

Further, the first and second control units 230 and 240 automatically control the intensities of the probe lights inputted to the first and second SOAs 215 and 221 in proportion to the intensities of the first and second pump lights 203 and 204, respectively. That is, the first control unit 230 extracts some of the first pump light 203 and controls the CW light source 211 to output the probe light 212 in proportion to the intensity of the first pump light 203. The second control unit 240 extracts some of the second pump light 204 and controls the intensity of the wavelength-converted probe light outputted from the first SOA 215 in proportion to the intensity of the second pump light 204. To this end, the intensities of the first and second probe lights 203 and 204 should be detected. First, some of the first plump light 203 is extracted using the first tab coupler 205.

The extracted first pump light 206 is converted into the electrical signal by the photo detector 207. The electrical signal is very weak, so the electrical signal is amplified by the light amplifier 208 and the amplified signal is transferred to the light source drive control means 210. At this time, the amplified signal is added to a preset offset voltage or current, and the added result is transferred to the CW light source 211. Accordingly, the probe light 212 having an intensity proportional to the intensity of the first pump light 203 is outputted from the CW light source 211. Subsequently, some of the second pump light 204 is extracted using the second tab coupler 220 and the extracted second pump light is converted into the electrical signal by the photo detector 217. The electrical signal is amplified by the light amplifier 218, and the amplified signal is transferred to the VOA 219. The wavelength-converted probe light outputted from the first SOA 15 is controlled by the amplified electrical signal corresponding to the intensity of the second pump light 204 in the VOA 219. Accordingly, the intensity of the probe light inputted to the second SOA 221 is automatically controlled in proportion to the intensity of the second pump light 204. Only the wavelength-converted probe light and the wavelength-converted probe light 223 of the signals outputted from the first and second SOAs 215 and 221 are passed through the first and second band pass filters 216 and 222.

As described above, the optical wavelength converter of the present invention allows a probe light to be influenced by the cross-gain modulations of two SOAS, and allows the width of the modulation of the probe light to be further increased, thereby improving the extinction ratio after wavelength conversion. Simultaneously, the optical wavelength converter of the present invention extracts some of the pump light through the tab coupler and automatically controls the value of bias current or voltage applied in the CW light source on the basis of the intensities of the extracted pump light so that the intensity of the probe light is proportional to the intensity of the pump light. Accordingly, although the intensity of the input optical signal may vary, the range in which the performance of the optical wavelength converter is constantly maintained is broadened by automatically controlling the intensity of the probe light on the basis of the intensity of the pump light, so the dynamic range of the input optical signal is improved.

Figure 3A:
FIGS. 3a to 3e are views illustrating differences in extinction ratios according to both application and non-application of the optical wavelength converter in accordance with the embodiment of the present invention.
Figure 3B:
Figure 3C:
Figure 3D:
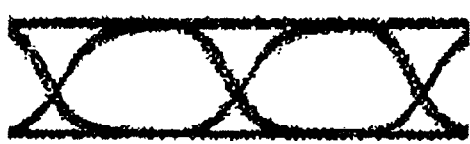
Figure 3E:

FIGS. 3a to 3e are views illustrating differences in extinction ratio before and after the application of the optical wavelength converter of the present invention, which, in particular, illustrates the extinction ratios of a conventional optical wavelength converter and the optical wavelength converter of the present invention. Referring to FIGS. 3a to 3e, FIG. 3a is an eye pattern of an input optical signal that is intensity-modulated to 2.5 Gb/s, FIGS. 3b and 3c are eye patterns of the conventional optical wavelength converter and the optical wavelength converter of the present invention at the time of 10 nm down-conversion, respectively, and FIGS. 3d and 3e are eye patterns of the conventional optical wavelength converter and the optical wavelength converter of the present invention at the time of 2 nm up-conversion, respectively. As shown in FIGS. 3b and 3c, it is seen that the extinction ratio of the optical wavelength converter of the present invention is further improved: 12.91 dB compared to 9.26 dB in the conventional optical wavelength converter at the time of 10 nm down-conversion. Further, as shown in FIGS. 3d and 3e, it is seen that the extinction ratio of the optical wavelength converter of the present invention is further improved: 8.86 dB compared to 5.92 dB in the conventional optical wavelength converter at the time of 2 nm up-conversion. As described above, it is appreciated that the extinction ratio of the optical wavelength converter of the present invention is improved compared to that of the conventional optical wavelength converter.

Figure 4:
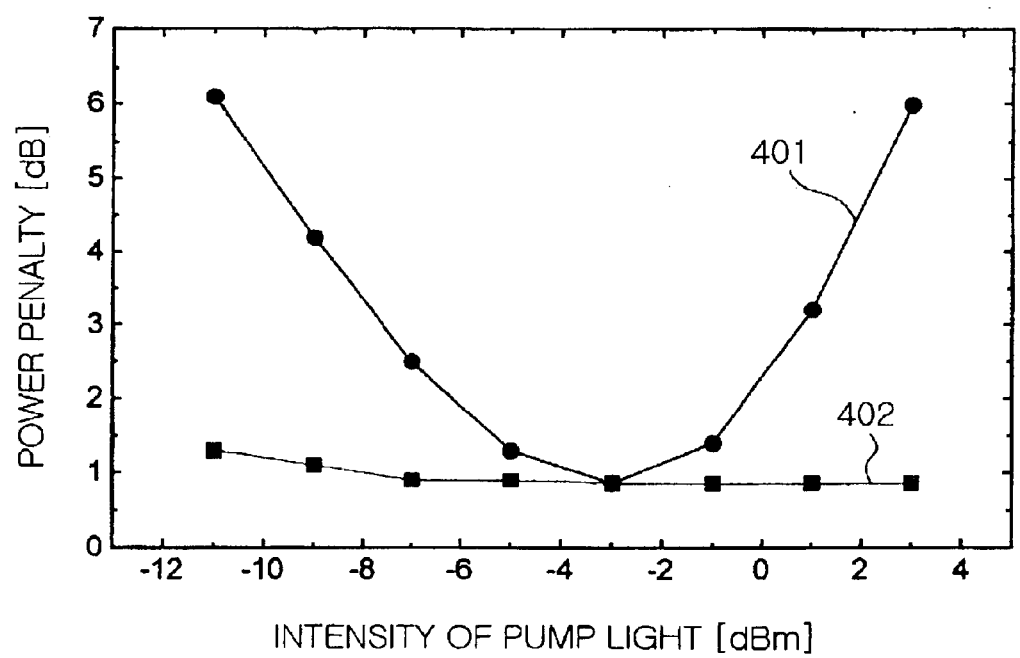
FIG. 4 is a graph illustrating differences in input dynamic ranges of both application and non-application of the optical wavelength converter in accordance with the embodiment of the present invention.

FIG. 4 is a graph illustrating differences in input dynamic range before and after the application of the optical wavelength converter of the present invention, which is a graph illustrating the variations of power penalties representing the performance of the optical wavelength converter on the basis of the intensity of the pump light. FIG. 4 shows a curve 401 of the power penalty, which is measured under conditions in which the intensity of the pump light varies from −11 dBm to 3 dBm at 2 dBm intervals and the intensity of the probe light is fixed to −6 dBm for each of varying values of the pump light, and a curve 402 of the power penalty, which is measured under conditions in which the intensity of the probe light varies in range lower than the intensity of the probe light by 3 dBm in the wavelength converter of the present invention. When the two are compared, it is seen that the performance of the optical wavelength converter varies very sensitively as shown in the curve 401, in the case of constantly maintaining the intensity of the probe light. On the contrary, it is seen that the performance of the optical wavelength converter is constantly maintained as shown in the curve 402, in the case of controlling the intensity of the probe light, though the intensity of the pump light varies. Accordingly, the optical wavelength converter having an input dynamic range of about 14 dBm can be implemented according to the present invention.

As described above, the optical wavelength converter of the present invention allows a probe light to be one more time influenced by the cross-gain modulations of two SOAs caused by each pump light respectively, and allows the width of the modulation of the probe light to be further increased, thereby improving the extinction ratio after wavelength-conversion. Further, the optical wavelength converter of the present invention detects the intensity of an optical signal inputted thereto and automatically controls the intensity of the probe light on the basis of the detected intensity of the input optical signal, thereby implementing a wide dynamic input range.

Further, the optical wavelength converter of the present invention operates with an optimum extinction ratio or a minimum power penalty, even though the intensity of the light signal inputted to the optical wavelength converter in WDM communication networks varies in its input range by more than 10 dBm.

Although a preferred embodiment of the present invention has been shown and described, the construction of the optical wavelength converter of the present invention may be variously applied and adapted without departing from technical ideas and may be applied to various optical wavelength conversion systems. Further, it would be easily appreciated by those skilled in the art that replacements, changes and modifications of elements of the optical wavelength converter of the present invention may be made according to its application fields.

Accordingly, the scope of the right of the present invention is determined not by the detailed descriptions and the drawings, but the accompanying claims.

What is claimed is:

1. A cross-gain modulation type optical wavelength converter converting the optical wavelength of a probe light outputted from a continuous wave light source by using an intensity-modulated pump light, comprising:

an optical division unit for dividing the intensity-modulated pump light into first pump light and second pump light on a basis of a predetermined light intensity ratio;

a first control unit for detecting an intensity of the first pump light and controlling an intensity of the probe light outputted from the continuous wave light source in proportion to the detected intensity of the first pump light;

a first semiconductor optical amplifier for performing a cross-gain modulation by using the first pump light and first converting the wavelength of the probe light outputted from the continuous wave light source on a basis of the cross-gain modulation;

a second control unit for controlling an intensity of the first wavelength-converted probe light outputted from the first semiconductor optical amplifier in proportion to an intensity of the second pump light; and a second semiconductor optical amplifier for performing a cross-gain modulation by using the second pump light and second converting the wavelength of the first wavelength-converted probe light intensity-controlled by the second control unit on a basis of the cross-gain modulation.

2. The optical wavelength converter according to claim 1, further comprising an optical phase control unit for controlling a phase of the second pump light so as to be in phase with the first pump light.

3. The optical wavelength converter according to claim 2, wherein said optical phase control unit includes an optical delay line.

4. The optical wavelength converter according to claim 1, further comprising first and second optical filtering units that pass therethrough only the first wavelength-converted probe light and the second wavelength-converted probe light of optical signals outputted from the first and second semiconductor optical amplifiers, respectively.

5. The optical wavelength converter according to claim 1, wherein said optical division unit divides the intensity-modulated pump light into two halves of equal light intensities.

6. The optical wavelength converter according to claim 1, wherein said first control unit comprises:

a first optical extraction means for extracting some of the first pump light;

a first optical detection means for detecting the extracted first pump light and converting the extracted first pump light into an electrical signal; and a light source drive control means for controlling the continuous wave light source using the electrical signal and a preset electrical offset signal.

7. The optical wavelength converter according to claim 6, wherein said first control unit further comprises a first optical amplifier for amplifying an output signal of the first optical detection means by a certain amount.

8. The optical wavelength converter according to claim 1, wherein said second control unit comprises:

a second optical extraction means for extracting some of the second pump light;

a second optical detection means for detecting the extracted second pump light and converting the extracted second pump light to an electrical signal;

a second optical amplifier for amplifying an output signal of the second optical detection means by a certain amount; and a variable optical attenuator (VOA) for controlling an attenuation intensity of the first wavelength-converted probe light outputted from the first semiconductor optical amplifier.

* * * * *